(12) United States Patent
Hoffmeyer (10) Patent No.: US 11,664,302 B2
(45) Date of Patent: May 30, 2023

(54) INTEGRATED CIRCUIT MODULE WITH A STRUCTURALLY BALANCED PACKAGE USING A BOTTOM SIDE INTERPOSER

(71) Applicant: International Business Machines Corporation, Armonk, NY (US)

(72) Inventor: Mark K. Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 17/128,023

(22) Filed: Dec. 19, 2020

(65) Prior Publication Data
US 2021/0111112 A1 Apr. 15, 2021

Related U.S. Application Data

(62) Division of application No. 16/205,672, filed on Nov. 30, 2018, now Pat. No. 11,195,789.

(51) Int. Cl.
*H01L 23/498* (2006.01)
*H01L 21/48* (2006.01)
(Continued)

(52) U.S. Cl.
CPC .... *H01L 23/49833* (2013.01); *H01L 21/4867* (2013.01); *H01L 23/145* (2013.01); *H01L 23/147* (2013.01); *H01L 23/15* (2013.01)

(58) Field of Classification Search
CPC ....... H01L 23/48; H01L 23/14; H01L 23/498; H01L 2224/16225; H01L 23/147;
(Continued)

(56) References Cited

U.S. PATENT DOCUMENTS

| 4,221,047 A | 9/1980 | Narken et al. |
| 5,209,798 A | 5/1993 | Solomon et al. |

(Continued)

FOREIGN PATENT DOCUMENTS

JP 2011155149 A * 8/2011 ............. H01L 23/15

OTHER PUBLICATIONS

Hoffmeyer, Mark K., "Integrated Circuit Module With a Structurally Balanced Package Using a Bottom Side Interposer" U.S. Appl. No. 16/205,672, filed Nov. 30, 2018.
(Continued)

*Primary Examiner* — Alexander O Williams
(74) *Attorney, Agent, or Firm* — Grant Johnson (57) ABSTRACT

A bottom side interposer provides a structurally balanced chip carrier module to reduce thermal warp and increase package robustness. The bottom side interposer is attached to the bottom of a chip carrier which carries semiconductor chips on the top side of the chip carrier. The top side of the chip carrier typically includes a top side interposer between the semiconductor chips and the chip carrier. The bottom side interposer has a coefficient of thermal expansion (CTE) that is similar to the chips and top side interposer, or tailored to have a CTE intermediate to the chips and the chip carrier. Pads on the bottom side interposer may be plated or fitted with solder balls to complete the module so the module can be connected to a printed circuit board.

15 Claims, 7 Drawing Sheets

(51) Int. Cl.
*H01L 23/14* (2006.01)
*H01L 23/15* (2006.01)

(58) Field of Classification Search
CPC .......... H01L 23/34; H01L 2924/15311; H01L 23/15; H01L 23/145; H01L 23/5384; H01L 2924/18161; H01L 23/49833; H01L 21/4867
USPC ........................................................ 257/773
See application file for complete search history.

(56) References Cited

U.S. PATENT DOCUMENTS

| | | | |
|---|---|---|---|
| 5,574,630 A * | 11/1996 | Kresge | H01L 23/5384 |
| | | | 257/E23.079 |
| 5,977,640 A * | 11/1999 | Bertin | H01L 24/97 |
| | | | 257/738 |
| 6,335,491 B1 | 1/2002 | Alagaratnam et al. | |
| 6,399,892 B1 | 6/2002 | Milkovich et al. | |
| 6,399,898 B1 * | 6/2002 | Kwong | H05K 1/14 |
| | | | 361/784 |
| 6,516,513 B2 | 2/2003 | Milkovich et al. | |
| 8,089,142 B2 | 1/2012 | Brooks | |
| 8,344,516 B2 | 1/2013 | Chainer | |
| 8,411,459 B2 | 4/2013 | Yu | |
| 8,587,132 B2 | 11/2013 | Zhao | |
| 8,823,144 B2 | 9/2014 | Khan et al. | |
| 8,829,655 B2 | 9/2014 | Zhao | |
| 8,829,656 B2 | 9/2014 | Zhao | |
| 8,946,900 B2 | 2/2015 | Qian | |
| 9,059,161 B2 | 6/2015 | Andry et al. | |
| 9,082,674 B2 | 7/2015 | Zhang | |
| 9,167,694 B2 | 10/2015 | Sundaram et al. | |
| 9,312,240 B2 | 4/2016 | Le et al. | |
| 9,472,479 B2 * | 10/2016 | Chaparala | H01L 23/15 |
| 9,893,004 B2 | 2/2018 | Yazdani | |
| 9,917,045 B2 | 3/2018 | Chaparala et al. | |
| 10,256,198 B2 | 4/2019 | Li et al. | |
| 10,548,230 B2 | 1/2020 | McClain et al. | |
| 10,952,333 B2 | 3/2021 | McClain et al. | |
| 11,195,789 B2 | 12/2021 | Hoffmeyer | |
| 2002/0041489 A1 | 4/2002 | Fritz | |
| 2003/0089936 A1 * | 5/2003 | McCormack | G11C 29/50 |
| | | | 257/296 |
| 2005/0023032 A1 | 2/2005 | Kawai et al. | |
| 2006/0043567 A1 | 3/2006 | Palanduz | |
| 2008/0244902 A1 * | 10/2008 | Blackwell | H05K 1/186 |
| | | | 29/830 |
| 2009/0241332 A1 * | 10/2009 | Lauffer | H05K 3/462 |
| | | | 29/829 |
| 2011/0080713 A1 * | 4/2011 | Sunohara | H01L 23/49827 |
| | | | 361/760 |
| 2014/0061886 A1 | 3/2014 | Zhao | |
| 2014/0231126 A1 * | 8/2014 | Hunrath | H05K 3/4069 |
| | | | 174/264 |
| 2015/0221571 A1 | 8/2015 | Chaparala | |
| 2015/0255434 A1 | 9/2015 | Yazdani | |
| 2015/0287672 A1 | 10/2015 | Yazdani | |
| 2016/0056087 A1 | 2/2016 | Wu | |
| 2016/0099197 A1 | 4/2016 | Uematsu et al. | |
| 2016/0172288 A1 * | 6/2016 | Audet | H01L 21/0274 |
| | | | 361/783 |
| 2016/0286660 A1 | 9/2016 | Gambino et al. | |
| 2018/0156841 A1 * | 6/2018 | Neely | H01L 25/0655 |

OTHER PUBLICATIONS

Appendix P—List of IBM Patents or Patent Applications Treated as Related, dated Jan. 23, 2021.

* cited by examiner

INTEGRATED CIRCUIT MODULE WITH A STRUCTURALLY BALANCED PACKAGE USING A BOTTOM SIDE INTERPOSER

BACKGROUND

1. Technical Field

This disclosure generally relates to integration and packaging of semiconductor circuits, and more specifically relates to a structure and method for an integrated circuit module with a structurally balanced package using a bottom side interposer.

2. Background Art

Large scale 2.5 dimensional (2.5D) & 3 dimensional (3D) high performance packaging solutions are becoming increasingly more common for field programmable gate arrays, microprocessors and graphics processing unit applications. These packaging solutions typically possess one or more silicon devices affixed to a chip carrier and often with a top side silicon, or glass interposer. An interposer is a silicon or glass layer that provides electrical interface routing between one socket or connection layer to another. The purpose of an interposer is to spread a connection to a wider pitch or to reroute a connection to a different connection. The interposer uses silicon through vias (STVs) or through glass vias (TGVs) for redistribution wiring and micro-bump interconnects to attach a silicon device or chip to a carrier.

Although an interposer provides exceptional wiring redistribution function and also keep stresses on silicon die low, subsequent reflow to the assembly can cause substantial warp due to difference in the coefficient of thermal expansion (CTE) of the different materials of the module. The warp from expansion can undermine critical features such as solder yield and cause delamination. To mitigate these concerns in the prior art, large perimeter stiffeners are usually applied to these package devices, but substantial warp may still remain depending on application specific packaging attributes. Other mitigation also includes use of intermediate CTE organic chip carriers, which also help minimize/graduate CTE mismatch induced warp. However, for large packages containing large interposers, substantial warp may still exist after reflow assembly to a printed circuit board due to a general imbalance of CTE attributes within the device package itself, even when both intermediate CTE laminates and external stiffening solutions are applied. These post assembly strains can also cause other detrimental chip/package interactions including device cracking, metallization delamination, dielectric delamination, and deterioration interconnect robustness, especially when parts are exposed to power on off thermal cycling.

BRIEF SUMMARY

A bottom side interposer provides a structurally balanced chip carrier module to reduce thermal warp and increase package robustness. The bottom side interposer is attached to the bottom of a chip carrier which carries semiconductor chips on the top side of the chip carrier. The bottom side interposer is preferably attached to the chip carrier with a lamination adhesive sheet and transient liquid metal paste deposits. The top side of the chip carrier typically includes a top side interposer between the semiconductor chips and the chip carrier. The bottom side interposer has a coefficient of thermal expansion (CTE) that is similar to the chips and top side interposer, or tailored to have a CTE intermediate to the chips and the chip carrier.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and.

DETAILED DESCRIPTION

The disclosure and claims herein relate to a bottom side interposer that provides a structurally balanced chip carrier module to reduce thermal warp and increase package robustness. The bottom side interposer is attached to the bottom of a chip carrier which carries semiconductor chips on the top side of the chip carrier. The bottom side interposer is preferably attached to the chip carrier with a lamination adhesive sheet and transient liquid metal paste deposits. The top side of the chip carrier typically includes a top side interposer between the semiconductor chips and the chip carrier. The bottom side interposer has a coefficient of thermal expansion (CTE) that is similar to the chips and top side interposer, or tailored to have a CTE intermediate to the chips and the chip carrier.

Figure 1A:
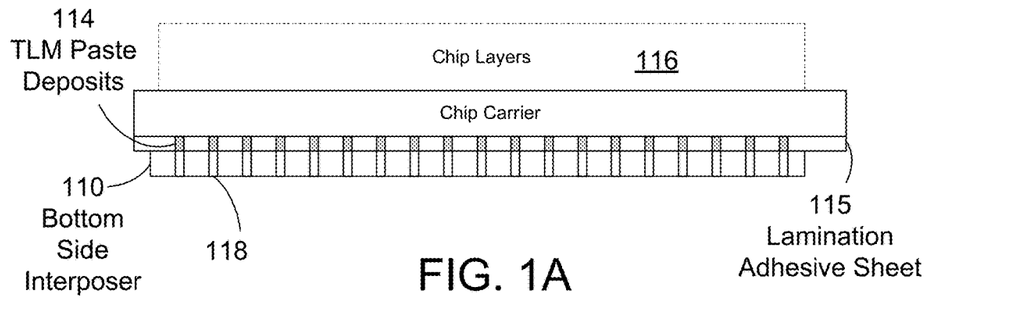
FIG. 1A is a block diagram to illustrate a bottom side interposer on a chip carrier module.

Referring to FIG. 1, FIG. 1A is a block diagram that illustrates an example of a bottom side interposer on a chip carrier package. In this example, a bottom side interposer 110 is attached to a chip carrier 112 using a lamination process and a laminate adhesive sheet 115. The lamination adhesive sheet 115 has apertures in it to accommodate selective deposition of transient liquid metal (TLM) paste to form TLM paste deposits 114. The TLM paste deposits 114 provide electrical interconnections to the carrier when heated during the bonding process. The TLM paste 114 is a compound that incorporates a mixture of elemental metal or metal alloy particles with some fraction of the particle constituency having low temperature melting points that can range from less than 125 C to about 180 C. The TLM paste is selectively applied to interconnect pad locations at the apertures in the laminate adhesive sheet and is used to metallurgically bond the bottom side interposer 110 to the chip carrier 112 at low temperature as described further below. Once the low melt constituency of the TLM paste reflows it reacts with the balance of the particle constituency of the TLM paste and interconnect pad surfaces to form high melting temperature bonds. On subsequent heating processes, the melting temperature of the bonds is well in excess of 300 C. Additional chip layers 116 may be placed on the top side of the chip carrier 112 as described further below.

Again referring to FIG. 1A, the chip carrier 112 has internal wiring and top interconnect pads for attachment to chip layers 116 that may include a number of chips and a top side interposer layer as described below. The bottom of the chip carrier 112 has an array of pads (not shown) that are attached to corresponding pads on the bottom side interposer 110 with the TLM paste. Thru interposer vias (TIVs) 118 in the bottom side interposer 110 connect pads from the top surface of the bottom side interposer to the bottom surface of the bottom side interposer 110. The pads on the bottom side interposer 110 may then be connected to a printed circuit board as described below.

Again referring to FIG. 1A, the TLM paste deposits 114 are used to bond connection pads on the bottom side interposer 110 to the chip carrier 112. The TLM paste deposits 114 react with the metal of the pads and forms a high temperature intermediate phase bond that is stable for subsequent higher temperature cycles for bonding the chip layers 116. The chip carrier 112 may be made of an organic laminate including epoxide based laminates or other suitable organic chip carrier materials such as rigid or flexible substrates made from polyimide composites. In this example, the chip carrier 112 is an organic module laminate with a conventional or a reduced coefficient of thermal expansion. However, even organic module laminates with reduced coefficient of thermal expansion have a coefficient of thermal expansion significantly higher than silicon and glass making up the chip layers 116. For example, intermediate CTE laminates have CTEs in the range of 10-12 ppm compared to a glass or silicon CTE of 0.5 to 3 ppm. The bottom side interposer 110 is a layer of glass or silicon with a coefficient of thermal expansion that is substantially the same as the chip layers 116. Wherein substantially the same means the CTE of the bottom side interposer is within about 5 ppm of the top layers, or preferably within 2 ppm and most preferably within about 1 ppm. Alternatively, the CTE of the bottom side interposer may be tailored to have a CTE intermediate to the chips layers 116 and the chip carrier 112. For example, if the CTE of the chip carrier 112 is 10 ppm and the CTE of the top side components in the chip layer 116 is 2 ppm, the CTE of the bottoms side interposer may be chosen to be about 6 ppm. Placing a bottom side interposer 110 on the bottom of the chip carrier 112 creates an interposer/laminate/interposer structure with a balanced coefficient of thermal expansion (CTE) by having a layer on either side of the chip carrier 112 with the same or a balanced CTE.

Thermo-mechanical modeling of specific packaging applications can be used to select an appropriate thickness of flexible glass or silicon bottom side interposer to ensure balanced CTE matching and optimized minimal warp when device attachment takes place. Although the chip carrier substrate may still warp with a backside interposer present during heating required for device attachment on the top side, the carrier module with the balanced CTE structure will flatten out when cooled. The thickness and material makeup of the bottom side interposer 110 is selected to match or closely match the thickness and CTE of the chip layers 116. For example, the bottom side interposer may be selected to have a CTE matching that of the chip layers 116 and a thickness of between 25% and 125% of the thickness of the chip layers 116. The balanced CTE carrier structure reduces typical laminate carrier warp during subsequent processing and attachment to the printed circuit board. The balanced CTE structure may also reduce or eliminate the need for other methods to control carrier warp which are very costly and can drive significant yield loss.

Figure 1B:
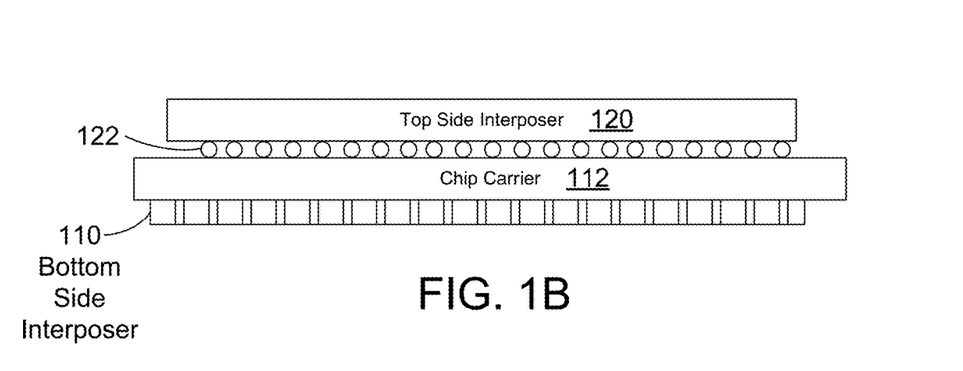
FIG. 1B is a block diagram to illustrate placing a top side interposer on a chip carrier with a bottom side interposer using solder balls.

FIG. 1B is a block diagram to illustrate placing a top side interposer on a chip carrier with a bottom side interposer. This example begins with the chip carrier 112 attached to the bottom side interposer 112 as described above with reference to FIG. 1A. A top side interposer 120 is attached to the chip carrier 112 with solder balls 122 to connect between pads (not shown) on the chip carrier 112 and corresponding pads (not shown) on the top side interposer 120. The combined package is heated to flow the solder balls 122. The top side interposer 120 may be similar in construction and material as discussed above for the bottom side interposer 110. The top side interposer 120 may be constructed of a layer of glass or silicon with a CTE which is typically much lower than the chip carrier 112 as discussed above. Further, the top side interposer may include thru interposer vias (TIVs) (not shown) to connect pads from the top surface of the chip carrier semiconductor components or chips as described below.

Figure 1C:
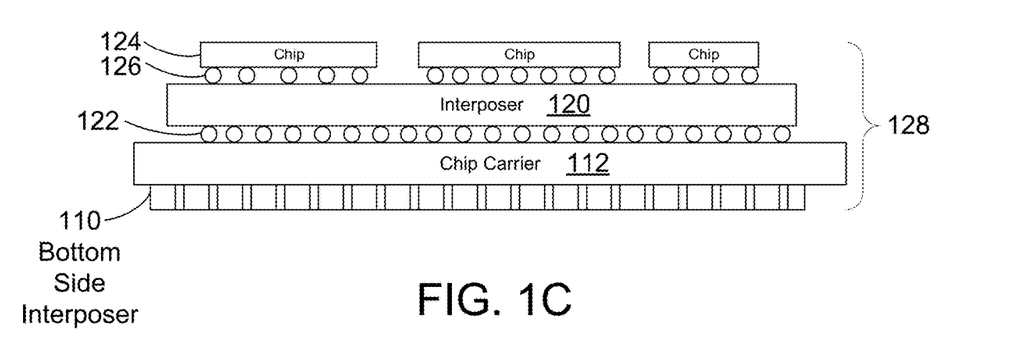
FIG. 1C is a block diagram showing an example of semiconductor chips placed on the top side interposer shown in FIG. 1B.

FIG. 1C is a block diagram showing an example of semiconductor chips placed on the top side interposer shown in FIG. 1B. In this example, several semiconductor chips 124 are positioned on the top side interposer 120 with solder balls 126. The assembly is then heated to flow the solder balls 126 to complete the attachment of the chips 124 to create a chip carrier module 128. In this example, the chips 124 and the top side interposer 120 make up the chip layers 116 shown in FIG. 1A. The chip carrier module 128 is then ready to be prepared for placement on a printed circuit board.

Figure 1D:
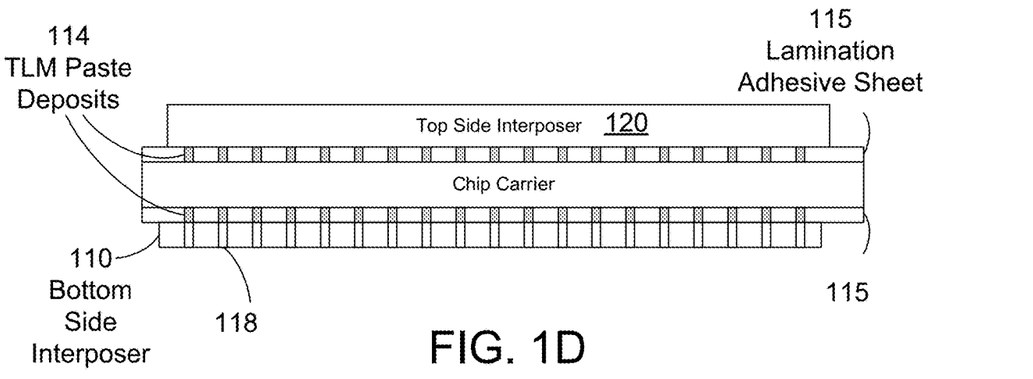
FIG. 1D is a block diagram showing an example of using the TLM paste to attach the top side interposer.

FIG. 1D is a block diagram to illustrate another example of placing a top side interposer on a chip carrier with a bottom side interposer. In this example both the bottom side interposer 110 and to the top side interposer 120 are attached to the chip carrier 112 with TLM paste as described above. The interposers 110, 120 can be attached to the chip carrier 112 in any order. Further, the TLM paste deposits 114 for the interposers 110, 120 may be heated separately or together to bond the interposers to the chip carrier 112. The top side interposer 120 may be similar in construction and material as discussed above for the bottom side interposer 110.

Figure 2:
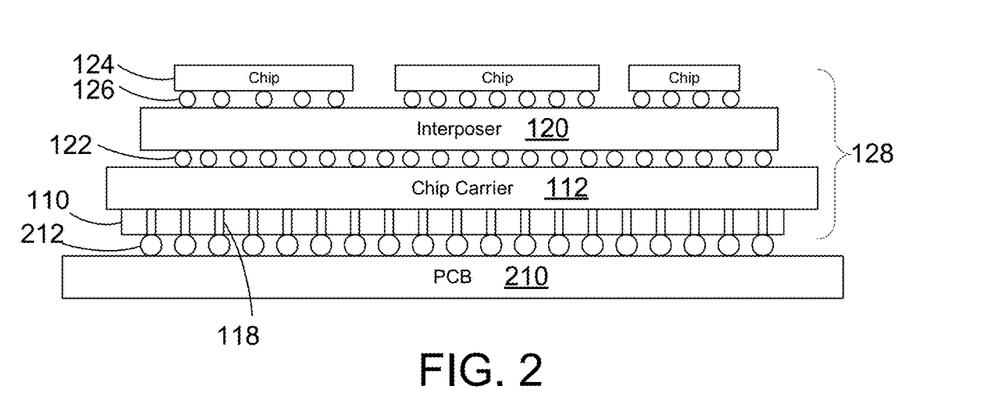
FIG. 2 is a block diagram showing an example of placing a completed chip module with a bottom side interposer on a printed circuit board.

FIG. 2 is a block diagram illustrating an example of placing a completed chip carrier module 128 on a printed circuit board (PCB) 210. The bottom side interposer 110 may be connected to the printed circuit board 210 using ball grid array (BGA) packaging. In BGA packaging, solder balls are attached to pads on through vias 118 of the interposer 110 and the completed chip carrier module 128 by heating the assembly sufficiently to reflow the balls to the attach pads. The completed module with attached solder balls is placed onto printed wiring board 210 and the entire assembly is heated to reflow the solder balls and complete the connection between the chip carrier module 128 and the printed circuit board 210.

Figure 3A:
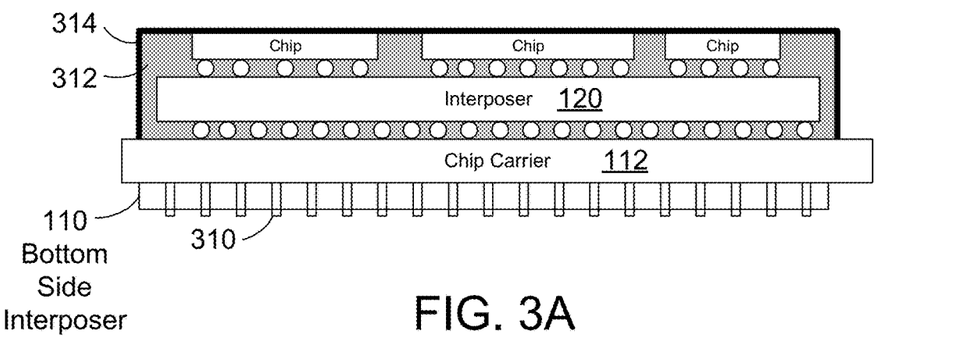
FIG. 3A is a block diagram showing an example of carrier a module with a bottom side interposer using Ni/Au plating for connection to a printed circuit board with the chips underfilled and lidded.

FIG. 3A is a block diagram illustrating another method for preparing the chip carrier module for attachment to a printed circuit board. This example uses what is known as a land grid array (LGA) connection. Land grid array is a packaging technology with a rectangular grid of contacts on the underside of a package or module that makes connection to a corresponding grid of noble metal plated contact springs on the printed circuit board (contact springs not shown). These contact springs may be single sided and directly soldered to the printed circuit board pads, or may reside in a connector housing known as a Hybrid Land Grid Array (HLGA) socket connector that uses solder ball attachments to affix the connector to the circuit board. Similarly, contacts may be double sided and reside in a true Land Grid Connector (LGA) socket housing that provides mechanical attachment to both the printed circuit board and the module. In this example, pads on the bottom of the bottom side interposer 110 are plated 310 with a layer of nickel followed by a thin layer of gold prior to interposer attachment to carrier 112 with the TLM paste as described above. The plated pads on the bottom side interposer make connection with corresponding contact springs pins on a printed circuit board when the chip carrier module is mated to the printed circuit board. The example in FIG. 3A further illustrates some optional steps that may be used in conjunction with the bottoms side interposer. For example, the top side interposer 120 may be underfilled 312 with an appropriate compound. The compound and the chips may be planarized in a manner known in the prior art to flatten the surface to enable an improved thermal interface construction for optimized heat conduction. In addition, a lid 314, along with an appropriate thermal interface material applied between the chip surfaces and the interior lid surface (not shown) may be added for structural stability and to aid in heat conduction.

Figure 3B:
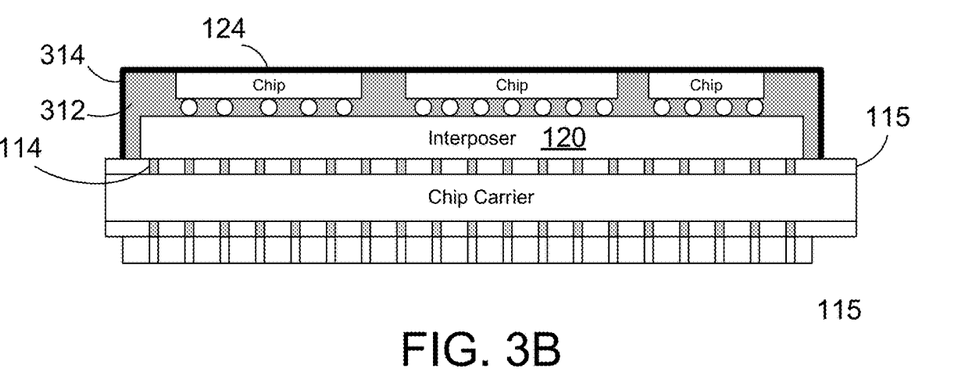
FIG. 3B is a block diagram showing an example of carrier a module with the top side interposer and the bottom side interposer attached using TLM paste with the chips underfilled and lidded.

FIG. 3B is a block diagram illustrating another method for preparing a chip carrier module with a bottom side interposer. In this example, the top side interposer is attached with TLM paste deposits 116 and a laminate adhesive sheet 115 as described with reference to FIG. 1D. This example further illustrates the chips 124 attached to the top side interposer 120, underfilled 312 and lidded 314 as described above with reference to FIG. 3A. Note that specific bottom side interposer attachment pad features such as plating or solder balls used for interconnect of the module to a printed circuit board are not shown.

Figure 4:
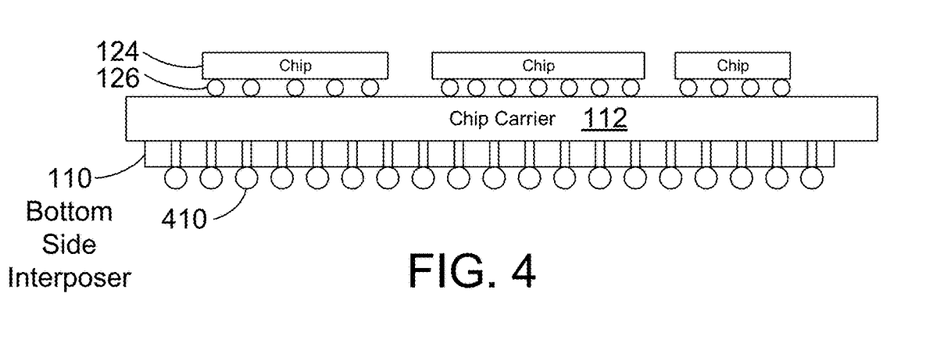
FIG. 4 is a block diagram showing another example of chip a carrier module with a bottom side interposer.

FIG. 4 is a block diagram showing another example of chip carrier module with a bottom side interposer. In this example, the bottom side interposer 110 is attached to the bottom of the chip carrier 112 as described above. The chips 124 are attached to the top of the chip carrier 112 directly without a top side interposer. The bottom side interposer 110 may include solder balls 410 for connection to a printed circuit board as described above. Alternatively the bottom side interposer 110 may be plated with a layer of nickel and gold for attachment to a printed circuit as described in the alternative embodiment above.

Figure 5:
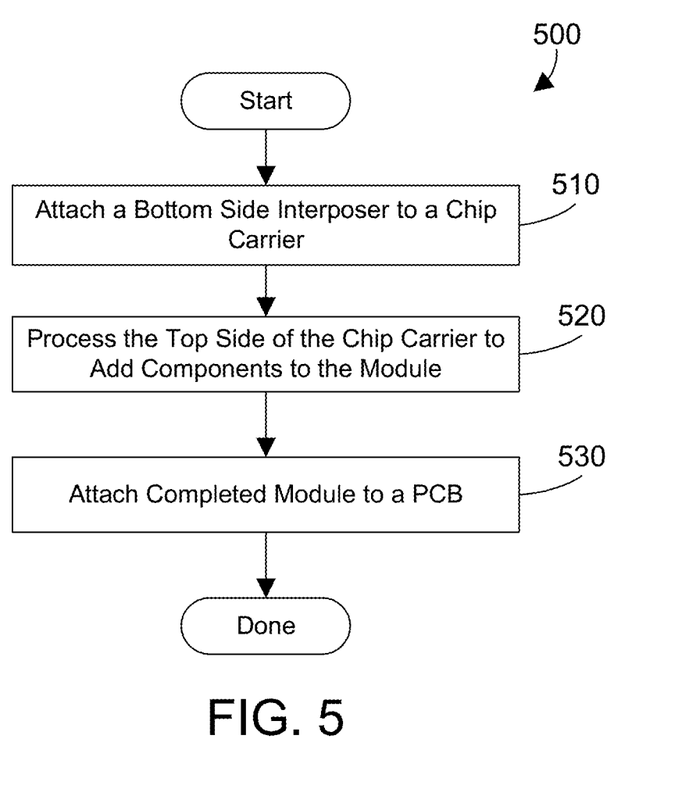
FIG. 5 is a flow diagram of a method for providing a chip carrier package on a printed circuit board.

Referring to FIG. 5, a method 500 shows one suitable example for providing a structurally balanced package for an integrated circuit module using a bottom side interposer. First, attach a bottom side interposer to a chip carrier (step 510). Process the top side of the chip carrier to add components to the module (step 520). Attach the completed module to a printed circuit board (step 530). The method is then done.

Figure 6:
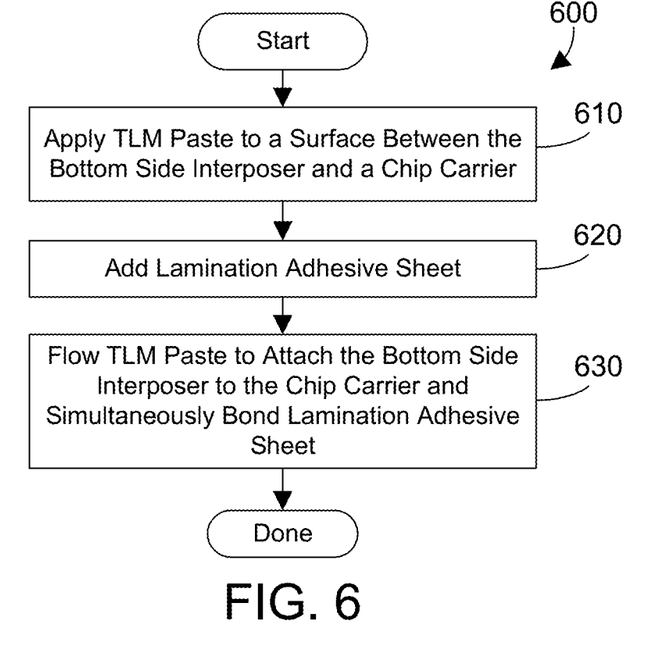
FIG. 6 is a flow diagram of a specific example method for step 510 in FIG. 5.

Referring to FIG. 6, a method 600 shows one suitable example for attaching a bottom side interposer to a chip carrier. Method 600 thus shows a suitable method for performing step 510 in method 500 in FIG. 5. First, apply a TLM paste to a surface between the bottom side interposer and a chip carrier (step 610). Next, add a lamination adhesive sheet between the bottom side interposer and the chip carrier. Then heat the module to flow the TLM paste and simultaneously bond the lamination adhesive sheet to attach the bottom side interposer to the chip carrier (step 620). The method is then done.

Figure 7:
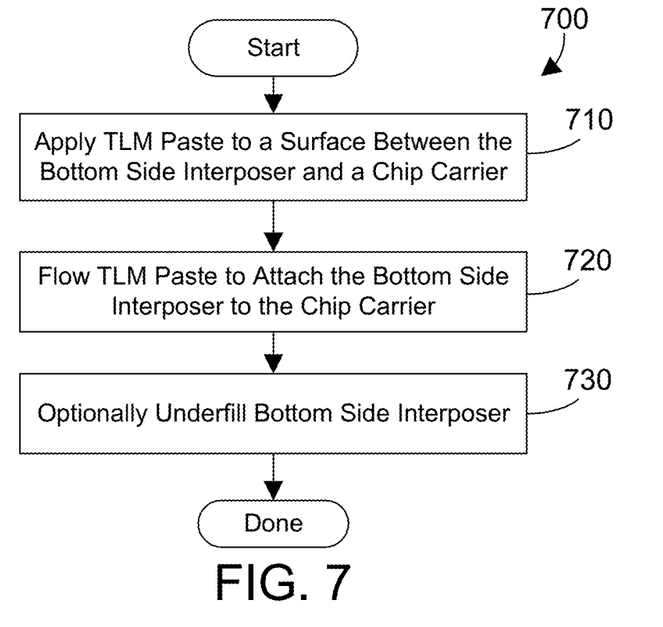
FIG. 7 is a flow diagram of another specific example method for step 510 in FIG. 5.

Referring to FIG. 7, a method 700 shows another suitable example for attaching a bottom side interposer to a chip carrier. Method 700 thus shows a suitable method for performing step 510 in method 500 in FIG. 5. First, apply a TLM paste to a surface between the bottom side interposer and a chip carrier (step 710). Next, flow the TLM paste to attach the bottom side interposer to the chip carrier (step 720). Optionally underfill the bottom side interposer (step 730). The method is then done.

Figure 8:
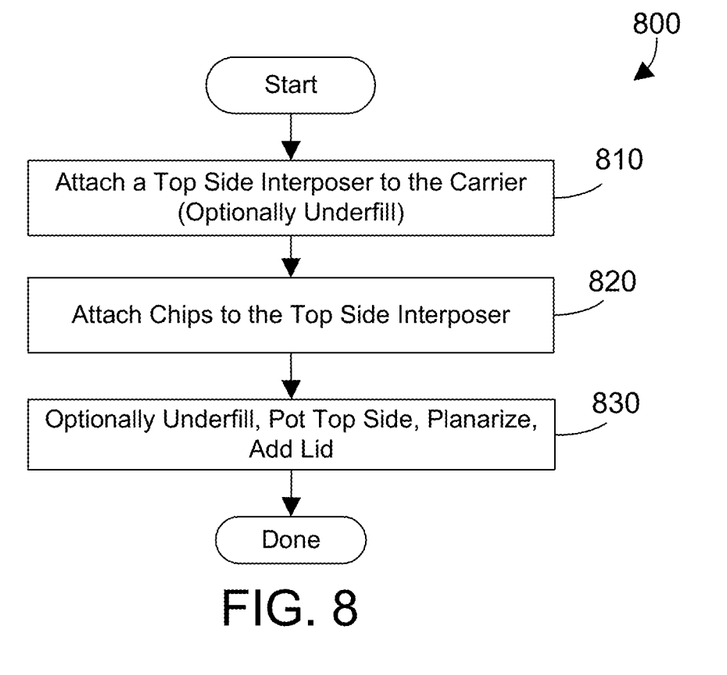
FIG. 8 is a flow diagram of a specific example method for step 520 in FIG. 5.

FIG. 8 shows one example of a suitable method 800 to process the top side of the chip carrier to add components to the module. Method 800 thus shows a suitable method for performing step 520 in method 500 in FIG. 5. First, attach a top side interposer to the top side of the chip carrier and optionally underfill the top side interposer (step 810). Note that the top side interposer may be attached before, after or at the same time the bottom side interposer is attached. Further, the top side interposer may be attached to the chip carrier with solder balls as shown in FIG. 1C or with TLM paste as shown in FIG. 1D. If the top side interposer is attached with solder balls the top side interposer may optionally be underfilled as described above. Next, attach chips to the top side interposer (step 820). Optionally under fill the chips, pot the topside, planarize the top side of the module and add a lid (step 730). The method 800 is then done.

Figure 9:
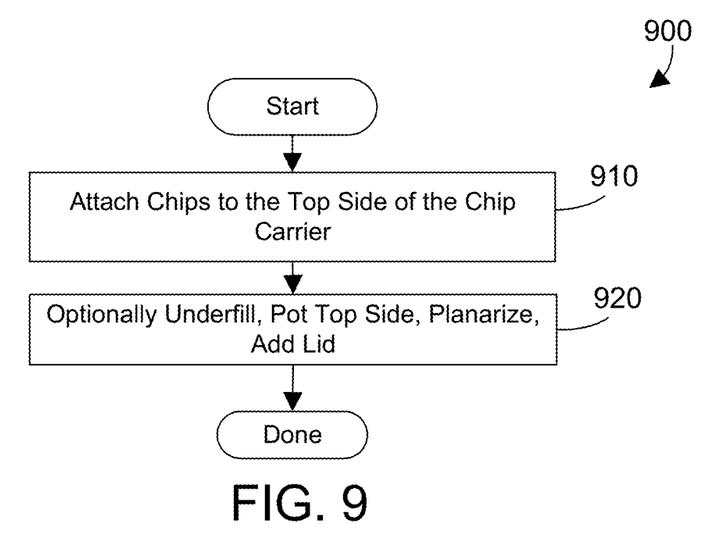
FIG. 9 is a flow diagram of another specific example method for step 520 in FIG. 5.

FIG. 9 shows another example of a suitable method 900 to process the top side of the chip carrier to add components to the module. Method 900 thus shows a second suitable method for performing step 520 in method 500 in FIG. 5. First, attach chips to the top side of the chip carrier (step 910). Optionally under fill the chips, pot the topside, planarize the top side of the module and add a lid (step 920). The method 900 is then done.

Figure 10:
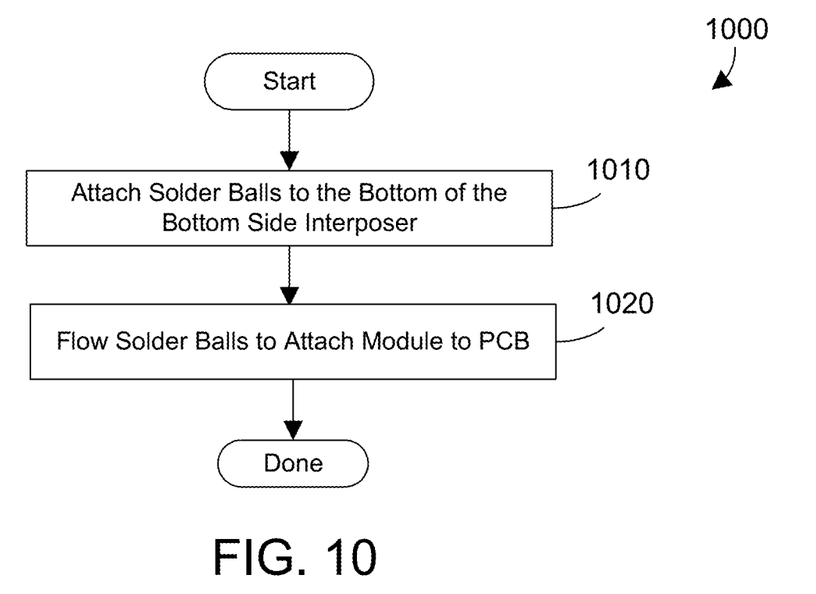
FIG. 10 is a flow diagram of a specific example method for step 530 in FIG. 5.

FIG. 10 shows an example of a method 1000 to prepare the bottom of the bottom side interposer for attachment to a printed circuit board. Method 1000 thus shows a suitable method for performing step 530 in method 500 in FIG. 5. Attach solder balls to the bottom of the bottom side interposer (step 1010). Flow the solder balls to attach the module to the printed circuit board (step 1020). The method 1000 is then done.

Figure 11:
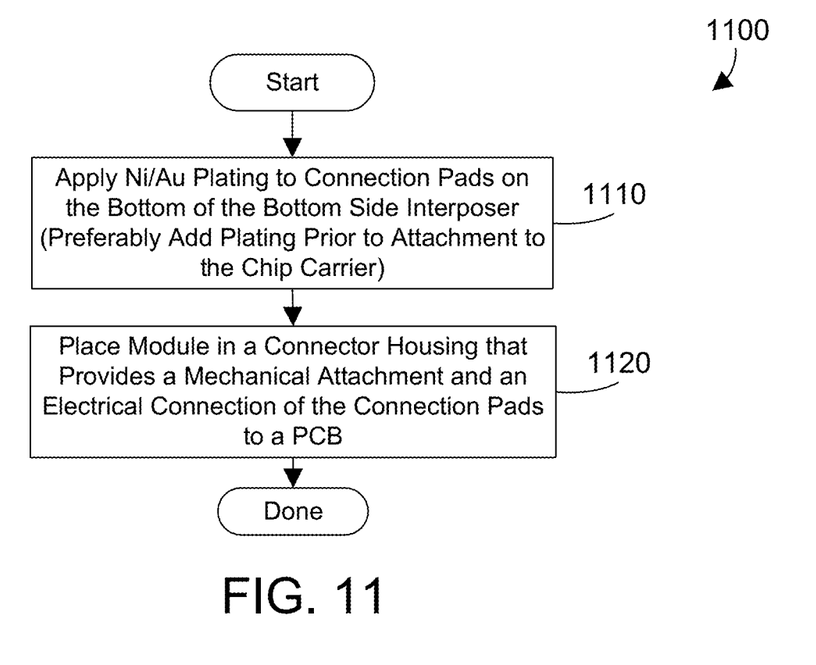
FIG. 11 is a flow diagram of another example method for step 530 in FIG. 5.

FIG. 11 shows another example of a method 1100 to prepare the bottom of the bottom side interposer for attachment to a printed circuit board. Method 1100 thus shows a second suitable method for performing step 530 in method 500 in FIG. 5. Apply nickel/gold plating to connection pads on the bottom of the bottom side interposer to create a land grid array (LGA) structure where the plating is preferably added prior to attachment of the bottom side interposer to the chip carrier (step 1110). Next, place the module in a connector housing that provides a mechanical attachment and an electrical connection of the connection pads to the printed circuit board (step 1120). The method 1100 is then done.

The disclosure and claims herein relate to a system and method for a bottom side interposer which provides a structurally balanced chip carrier module to reduce thermal warp and increase package robustness. The bottom side interposer is attached to the bottom of a chip carrier which carries semiconductor chips on the top side of the chip carrier and typically includes a top side interposer. The bottom side interposer has a coefficient of thermal expansion the same or similar to the chips and top side interposer to create a balanced CTE module.

The claims and disclosure herein support an article of manufacture comprising: a chip carrier; a bottom side interposer attached to a bottom side of the chip carrier wherein the bottom side interposer comprises a layer of material chosen from silicon, glass and low CTE organic composite materials including CTE laminates; at least one semiconductor chip attached to a top side of the chip carrier; and wherein a coefficient of thermal expansion of the bottom side interposer is between a coefficient of thermal expansion of the semiconductor chip and a coefficient of thermal expansion of the chip carrier.

The claims and disclosure herein further support a method for processing a semiconductor chip module comprising: attaching a bottom side interposer to a chip carrier wherein the bottom side interposer comprises a layer of material chosen from silicon and glass; processing a top side of the chip carrier to add at least one semiconductor chip; and wherein a coefficient of thermal expansion of the bottom side interposer is between a coefficient of thermal expansion of the semiconductor chip and a coefficient of thermal expansion of the chip carrier.

The claims and disclosure herein further support a method for processing a semiconductor chip module comprising: attaching a bottom side interposer to a bottom side of a chip carrier by applying transient liquid metal paste deposits to a surface between the bottom side interposer and the chip carrier, adding a lamination adhesive sheet, and flowing the transient liquid metal paste while simultaneously bonding the lamination adhesive sheet, wherein the bottom side interposer comprises a layer of material chosen from silicon and glass; attaching a top side interposer layer to a top side of the chip carrier wherein a coefficient of thermal expansion of the top side interposer is substantially the same as the coefficient of thermal expansion of the bottom side interposer, wherein a coefficient of thermal expansion of the bottom side interposer is substantially the same as a coefficient of thermal expansion of the top side interposer and the semiconductor chip; and processing a top side of the chip carrier to add at least one semiconductor chip.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. An article of manufacture comprising:
a chip carrier;
a bottom side interposer attached to a bottom side of the chip carrier wherein the bottom side interposer comprises a layer of material chosen from silicon, glass, and low coefficient thermal expansion organic composite materials, wherein the bottom side interposer is attached to the chip carrier by applying transient liquid metal paste deposits to a surface between the bottom side interposer and the chip carrier, adding a lamination adhesive sheet, and flowing the transient liquid metal paste while simultaneously bonding the lamination adhesive sheet;
at least one semiconductor chip attached to a top side of the chip carrier; and
wherein a coefficient of thermal expansion of the bottom side interposer is between a coefficient of thermal expansion of the at least one semiconductor chip and a coefficient of thermal expansion of the chip carrier.

2. The article of manufacture of claim 1 wherein the coefficient of thermal expansion of the bottom side interposer is substantially the same as the coefficient of thermal expansion of the at least one semiconductor chip.

3. The article of manufacture of claim 1 further comprising a top side interposer layer between the chip carrier and the at least one semiconductor chip and wherein a coefficient of thermal expansion of the top side interposer layer is substantially the same as the coefficient of thermal expansion of the bottom side interposer.

4. The article of manufacture of claim 1 wherein the bottom side interposer is attached to the chip carrier with the transient liquid metal paste deposits and the lamination adhesive sheet.

5. The article of manufacture of claim 4 wherein the bottom side interposer is attached to the chip carrier using a ball grid array.

6. The article of manufacture of claim 4 wherein the bottom side interposer is attached to the chip carrier using a land grid array.

7. The article of manufacture of claim 1 wherein the bottom side interposer is underfilled.

8. The article of manufacture of claim 1 wherein the top side interposer is attached with the transient liquid metal paste deposits and the lamination adhesive sheet.

9. An article of manufacture, comprising:
a bottom side interposer attached to a bottom side of a chip carrier by:
a lamination adhesive sheet; and
a transient liquid metal paste deposited to a surface between the bottom side interposer and the chip carrier, wherein the transient liquid metal paste was flowed while simultaneously bonding the lamination adhesive sheet;
a top side interposer layer attached to a top side of the chip carrier; and
at least one semiconductor chip attached to the top side of the chip carrier;
wherein a coefficient of thermal expansion of the bottom side interposer is substantially the same as the coefficient of thermal expansion of the top side interposer layer and the at least one semiconductor chip; and
wherein the bottom side interposer comprises a layer of material chosen from silicon and glass.

10. The article of manufacture of claim 9, wherein the chip carrier is an organic module laminate.

11. The article of manufacture of claim 9, wherein the at least one semiconductor chip is adapted for attachment to a printed circuit board.

12. An article of manufacture comprising:
a chip carrier;
an underfilled bottom side interposer attached to a bottom side of the chip carrier, wherein the underfilled bottom side interposer comprises a layer of material chosen from silicon and glass;
at least one semiconductor chip attached to a top side of the chip carrier; and
a top side interposer layer attached between the chip carrier and the at least one semiconductor chip, wherein the top side interposer layer is covered with a lid;
wherein a coefficient of thermal expansion of the underfilled bottom side interposer is between a coefficient of thermal expansion of the at least one semiconductor chip and a coefficient of thermal expansion of the chip carrier; and
wherein a coefficient of thermal expansion between the top side interposer layer is substantially the same as the coefficient of expansion of the underfilled bottom side interposer.

13. The article of manufacture of claim 12, wherein a bottom side of the underfilled bottom side interposer is adapted for attachment to a printed circuit board using a ball grid array.

14. The article of manufacture of claim 12, wherein a bottom side of the underfilled bottom side interposer is adapted for attachment to a printed circuit board using a land grid array.

15. The article of manufacture of claim 14, wherein the at least one semiconductor chip is attached to the printed circuit board.

* * * * *